United States Patent
Wang et al.

(10) Patent No.: US 9,521,741 B1
(45) Date of Patent: Dec. 13, 2016

(54) SIDE SURFACE MOUNTING OF SHIELDS FOR A CIRCUIT BOARD ASSEMBLY

(71) Applicant: Amazon Technologies, Inc., Reno, NV (US)

(72) Inventors: Libo Wang, Guangdong (CN); Jasmin B. Farshi, San Jose, CA (US); Andrew Frederick Skipor, West Chicago, IL (US)

(73) Assignee: Amazon Technologies, Inc., Reno, NV (US)

( * ) Notice: Subject to any disclaimer, the term of this patent is extended or adjusted under 35 U.S.C. 154(b) by 244 days.

(21) Appl. No.: 14/295,855

(22) Filed: Jun. 4, 2014

(51) Int. Cl.
*H05K 7/18* (2006.01)
*H05K 9/00* (2006.01)
*H05K 1/02* (2006.01)

(52) U.S. Cl.
CPC .......... *H05K 1/0216* (2013.01); *H05K 9/0015* (2013.01); *H05K 9/0016* (2013.01); *H05K 9/0024* (2013.01); *H05K 9/0052* (2013.01); *H05K 9/0075* (2013.01); *H05K 9/0081* (2013.01); *H05K 2201/0715* (2013.01)

(58) Field of Classification Search
CPC ............. H05K 2201/0707; H05K 2201/10371; H05K 9/0016; H05K 9/0024; H05K 9/0052; H05K 9/0081; H05K 9/0015; H05K 9/0075
USPC ................... 361/800, 816, 818; 174/350, 351
See application file for complete search history.

(56) References Cited

U.S. PATENT DOCUMENTS

| | | |
|---|---|---|
| 5,354,951 A | 10/1994 | Lange, Sr. et al. |
| 5,482,198 A | 1/1996 | Kohn |
| 5,881,947 A | 3/1999 | Gurewitz et al. |
| 6,180,876 B1 | 1/2001 | Holmes |
| 6,183,301 B1 | 2/2001 | Paagman |
| 6,312,265 B1 | 11/2001 | Mohtar et al. |
| 6,377,473 B1 | 4/2002 | Huang et al. |
| 6,600,663 B1 | 7/2003 | Koleda |
| 7,089,646 B2 | 8/2006 | Leerkamp et al. |
| 7,259,969 B2 | 8/2007 | Zarganis et al. |
| 7,301,097 B2 | 11/2007 | Hiratsuka et al. |
| 7,383,977 B2 | 6/2008 | Fagrenius et al. |
| 7,443,693 B2 | 10/2008 | Arnold et al. |
| 8,043,098 B2 | 10/2011 | Huang |
| 8,792,246 B2 * | 7/2014 | Kratzer .......................... 174/354 |
| 2001/0033478 A1 | 10/2001 | Ortiz et al. |
| 2007/0075418 A1 | 4/2007 | Chen |
| 2007/0121307 A1 | 5/2007 | Yang et al. |
| 2008/0106884 A1 * | 5/2008 | English ................ H05K 9/0032 361/818 |
| 2008/0115967 A1 | 5/2008 | Giboney et al. |

(Continued)

OTHER PUBLICATIONS

Chen, et al., "Laser-Induced site-selective silver seeding on polyimide for electroless copper plating," Applied Surface Science, 253, pp. 1573-1580 (2006).

(Continued)

*Primary Examiner* — Binh Tran
(74) *Attorney, Agent, or Firm* — K&L Gates LLP

(57) ABSTRACT

A circuit board assembly includes a first shield positioned over a top surface of a printed circuit board and a second shield positioned over a bottom surface. The first and second shields include conductive tabs which are coupled to a first side surface of the circuit board, wherein the tabs of the first shield are generally interposed or staggered with the tabs of the second shield.

20 Claims, 7 Drawing Sheets

(56) References Cited

U.S. PATENT DOCUMENTS

2010/0178803 A1 7/2010 Chang
2011/0241932 A1 10/2011 Rowe
2013/0114228 A1 5/2013 Merz et al.
2013/0120957 A1 5/2013 Werner et al.
2014/0048310 A1 2/2014 Montevirgen et al.

OTHER PUBLICATIONS

Palmer, et al., "Forming Solder Joints by Sintering Eutectic Tin-Lead Solder Paste," Journal of Electronic Materials, vol. 28, No. 7, pp. 912-915 (1999).
Author Unknown, "CBS Circuit Board Shielding," Available at http://www.leadertechinc.com/catalogs/CBScatalog09,pdf , 28 pages (printed May 23, 2014).
Author Unknown, "Teardown iPhone5," Available at http://d3nevzfk7ii3be.cloudfront.net/igi/XjPtTNsxYRNf51UV.huge, 1 page (printed May 23, 2014).
Author Unknown, "iPhone 5 Teardown," Available at http://www.ifixit.com/Teardown/iPhone+5+Teardown/10525, 17 pages (printed May 23, 2014).

* cited by examiner

SIDE SURFACE MOUNTING OF SHIELDS FOR A CIRCUIT BOARD ASSEMBLY

BACKGROUND

Many electronic devices, such as tablet computers, electronic book readers, smartphones, and other mobile computing devices, include circuit board assemblies that have components that may need to be electromagnetically shielded. Conductive shields may be used to provide electromagnetic interference (EMI) and radio frequency (RF) shielding to reduce the coupling of radio waves, electromagnetic fields and electrostatic fields generated by the various components in the device. For example, electronic components may be surface mounted to a printed circuit board (PCB), and those electronic components may be electromagnetically shielded with a conductive shield that is placed over one or more of the electronic components and grounded to the PCB. Users of mobile computing devices that include circuit board assemblies may prefer that the devices be light in weight and small in size. Accordingly, it is desirable to reduce the size of components of the electronic device, as well as reduce the space between such components. Although it may be desirable to reduce the size of circuit board assemblies or couple more components to a circuit board assembly, electromagnetic shielding must continue to be maintained. Accordingly, there is a need to provide improved methods for providing shielding for circuit board assemblies.

DETAILED DESCRIPTION

In the following description, reference is made to the accompanying drawings which illustrate several embodiments of the present disclosure. It is to be understood that other embodiments may be utilized and system or process changes may be made without departing from the spirit and scope of the present disclosure. The following detailed description is not to be taken in a limiting sense, and the scope of the embodiments of the present invention is defined only by the claims of the issued patent. It is to be understood that drawings are not necessarily drawn to scale.

In accordance with embodiments of the present invention, an electronic device, such as a mobile computing device, includes a circuit board assembly with electronic components mounted to both sides of the printed circuit board (PCB). This circuit board assembly includes a first shield positioned over a top surface of the PCB and a second shield positioned over a bottom surface of the PCB. The first and second shields include conductive tabs which are coupled to a first side surface of the PCB. The tabs of the first shield are generally interposed or staggered with the tabs of the second shield.

Figure 1:
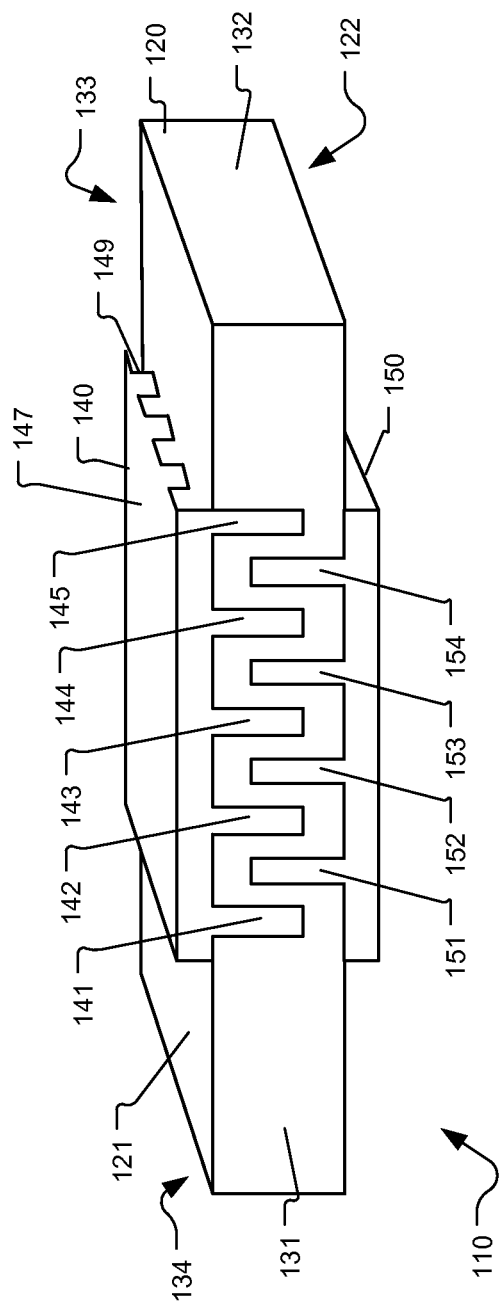
FIG. 1 illustrates an example perspective view of a circuit board assembly, in accordance with various embodiments of the present invention.

FIG. 1 illustrates an example perspective view of a circuit board assembly 110, in accordance with various embodiments of the present invention. As illustrated in FIG. 1, tabs 141-145 of a first shield 140 that are coupled to a first side surface 131 of a circuit board 120 are generally interposed or staggered with respective tabs 151-154 of a second shield 150 that are also coupled to the first side surface 131 of the circuit board 120.

In accordance with embodiments of the present invention, the circuit board assembly 110 includes a circuit board 120 that has a first major surface 121 and a second major surface 122 opposite the first major surface 121. Under some embodiments, one or more electrical components may be coupled to a major surface, such as the top or bottom surface of the circuit board 120. The circuit board 120 further includes one or more side surfaces extending between the first major surface 121 and the second major surface 122. As illustrated in FIG. 1, the circuit board 120 may include a first side surface 131, a second side surface 132 adjacent to the first side surface 131, a third side surface 133 adjacent to the second side surface 132 and opposed to the first side surface 131, and a fourth side surface 134 adjacent to the third side surface 133, adjacent to the first side surface 131, and opposed to the second side surface 132.

It is to be understood that although the circuit board 120 illustrated in FIG. 1 has a rectangular shape, the shape illustrated in FIG. 1 is not meant to be limiting. Under some embodiments, a circuit board 120 may have a square shape, a triangular shape, a curved shape, an L shape, as well as any other shapes. Additionally, the shape of a circuit board may determine the number and configuration of side surfaces of the circuit board. For example, a circuit board having an L shape may have six straight side surfaces, a circuit board having a triangular shape may have three straight side surfaces, and a circuit board having a circular shape may have a single curved side surface extending around the circumference of the circuit board.

A circuit board 120 comprises multiple layers, as is well known in the art. The circuit board 120 may include, for example, signal planes, insulating layers, grounding planes, power planes, and the like. In some embodiments, the multiple layers may be bonded together in a laminated sheet. A circuit board 120 may also include features such as pads, lands, traces, tracks, planes, structures, patterns, and the like. A pad may be gold, tin, silver plated, or the like.

Although not shown in FIG. 1, the circuit board assembly 110 may include one or more electronic components that are coupled to a major surface of a circuit board 120. For example, an electronic component may be coupled or mounted to an outer surface of a printed board 120. Such coupling may include electrically or mechanically fixing an electronic component to a circuit board 120. For example, an electronic component may have tabs or end caps that can be coupled or soldered directly onto a surface of a circuit board 120. Such coupling or soldering may occur by depositing a coupling material, such as solder or solder paste, to a feature of the circuit board 120, such as a pad, before the electronic component is positioned or placed on a surface of the circuit board 120. Solder may comprise an alloy material. Solder paste may comprise a solder powder and flux, resulting in a solder paste that may have a tacky or sticky consistency. The solder paste may adhere a tab of an electronic component to a surface of a circuit board 120. Solder paste may be deposited on a pad with a stencil, for example using a stencil printing process or solder jetting. A pick-and-place device or system may pick up an electronic component and position or place it onto the surface of the circuit board 120 proximate one or more pads. Thereafter, the coupling material may be heated, such as in an oven, to melt or reflow the coupling material. The coupling material may then be cooled, to solidify the coupling material and form a coupling or a joint. It is to be understood that the process for coupling an electronic component to a circuit board 120 is not limited to the above process. In some embodiments, such a process may comprise lead-free soldering, nano-soldering, sintering, laser welding, conductive adhesives, nano-fasteners such as hooks and loops, ultrasonic welding, diffusion, or the like.

In order to increase the density of electronic components in a device, it may be desirable to mount components to both sides of the circuit board 120. In accordance with embodiments of the present invention, one or more electronic components may be electrically coupled to a first major surface 121 of a circuit board 120 and one or more electronic components may be electrically coupled to a second major surface 122 of a circuit board 120. A coupling process may comprise a first step of coupling electronic components to a first major surface 121, and a second step of coupling electronic components to a second major surface 122.

A first shield 140 may be coupled to the circuit board 120. The first shield 140, or portions of the first shield 140 such as the planar portion 147 or the tabs 141-145, may comprise a conductive material, such as, for example, steel alloy, tin alloy, aluminum alloy, copper alloy, or other metal or metal alloy. In some embodiments, the first shield 140 may comprise a nonconductive material, such as a polymer, for example nylon or polycarbonate, that is plated with a conductive material. In some embodiments, the first shield 140 may comprise a base of metal or a polymer that is plated with one or more layers of a metal. Plating material may include gold, silver, copper, nickel, tin, and the like. For example, a first shield 140 may comprise a metal, such as copper, that is plated with a metal, such as silver, that is again plated with another metal, such as nickel. Such a first shield 140 may have a thickness of 0.2 millimeters, though it is to be understood that other thicknesses may be appropriate. For further example, a plating process of a nonconductive material that is plated with a conductive material may comprise a laser-induced site-selective silver seeding on a polyimide film for electroless copper or nickel plating. In some embodiments, a first shield 140 may comprise one or more rigidizers, such as corrugation, ridges, valleys, ribs, dents, and the like. Ridgidizers may increase stiffness, strength, resistance to pressure, and the like. Rigidizers may be beneficial to reduce a thickness or weight of a first shield 140, such as by reducing the amount of material of a first shield 140.

The first shield 140 may provide EMI or RF shielding to suppress electromagnetic interference received or transmitted in relation to at least one electronic component shielded by the first shield 140. A first shield 140 may comprise a first planar portion 147 that may be positioned over at least one electronic component coupled to a first major surface 121 of the circuit board 120. In some embodiments, the first planar portion 147 may be substantially parallel to the first major surface 121 of the circuit board 120. For example, a planar portion 147 may have a planar surface that extends over at least one electronic component. A first planar portion 147 may have a shape, such as a box, a can or a shell to provide, for example, a conductive barrier enveloping at least one electronic component or a Faraday cage enclosing at least one electronic component, such that the electronic component is surrounded on all sides by either the first planar portion 147 or the circuit board 120. In some embodiments, a first planar portion 147 may comprise a fence or frame and a cover or lid.

In some embodiments, a first shield 140 may be positioned over all of a first major surface 121. In alternative embodiments, as shown in FIG. 1, a first shield 140 may be positioned over a portion of a first major surface 121 that extends to a first side surface 131 of the circuit board 120. Under such an embodiment, one or more major surface tabs 149 of the first shield 140 may be coupled to the first major surface 121. It is to be understood that, although FIG. 1 depicts a single first shield 140, there may be a plurality of first shields 140 shielding different areas of the first major surface 121, and that the number of first shields 140 positioned over a respective area of a first major surface 121 is not meant to be limiting. For example, as illustrated in FIG. 1, tabs of the first shield 140 are coupled to a first side surface 131, and under an alternative embodiment, another first shield 140 may have tabs coupled to a second side surface 132.

It is to be understood that a second shield 150 with respect to a second major surface 122 and a first side surface 131 may have, for example, a similar configuration as disclosed for the first shield 140 with respect to the first major surface 121 and the first side surface 131.

A first shield 140 may comprise a plurality of tabs that extend from a first planar portion. For example, as depicted in FIG. 1, a first shield 140 may comprise a first tab 141, a second tab 142, a third tab 143, a fourth tab 144, and a fifth tab 145. Similarly, a second shield 150 may comprise a plurality of tabs that extend from a first planar portion. For example, as depicted in FIG. 1, a second shield 150 may comprise a first tab 151, a second tab 152, a third tab 153, and a fourth tab 154. Each tab may be coupled to a respective grounding contact, such as a pad, provided on the first side surface 131 of the circuit board 120. A grounding contact may be coupled to a grounding portion of a circuit board 120, such as a ground layer, a ground plane, a ground line, a ground trace, the ground of the circuit board 120, the earth of the circuit board 120, a grounding circuit, or the like. Under an embodiment, a first tab 151 of the second shield 150 may be positioned between a first tab 141 and a second tab 142 of the first shield 140. Furthermore, the first tab 151 of the second shield 150 may be spaced apart from the first tab 141 and the second tab 142 of the first shield 140.

Figure 2A:
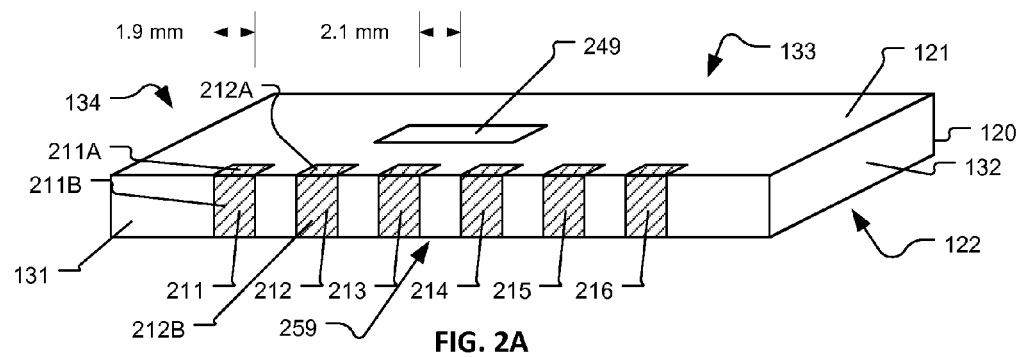
FIGS. 2A-2F illustrate example perspective views of exemplary results of steps for populating a circuit board, in accordance with various embodiments of the present invention.
Figure 2B:
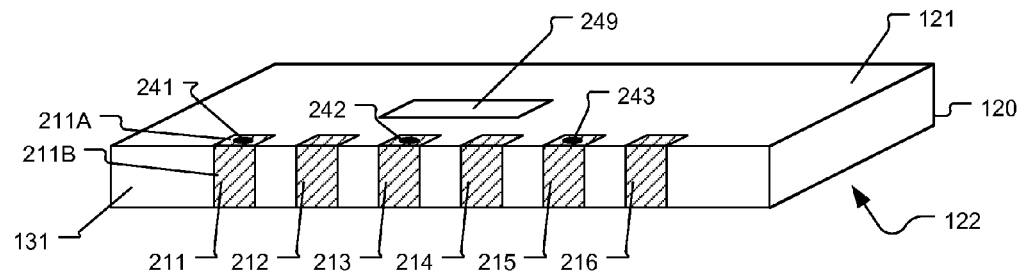
Figure 2C:
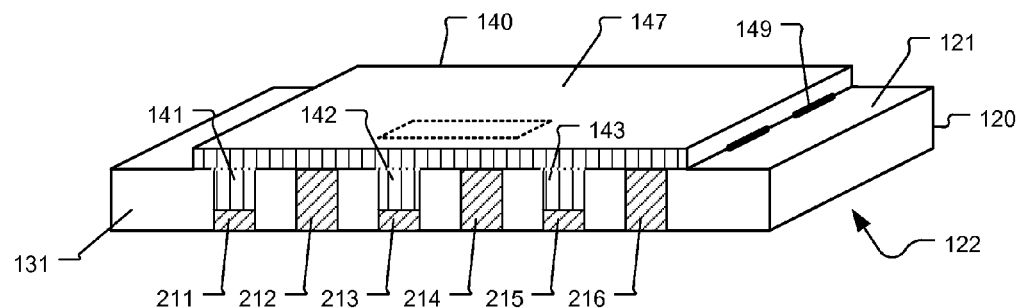
Figure 2D:
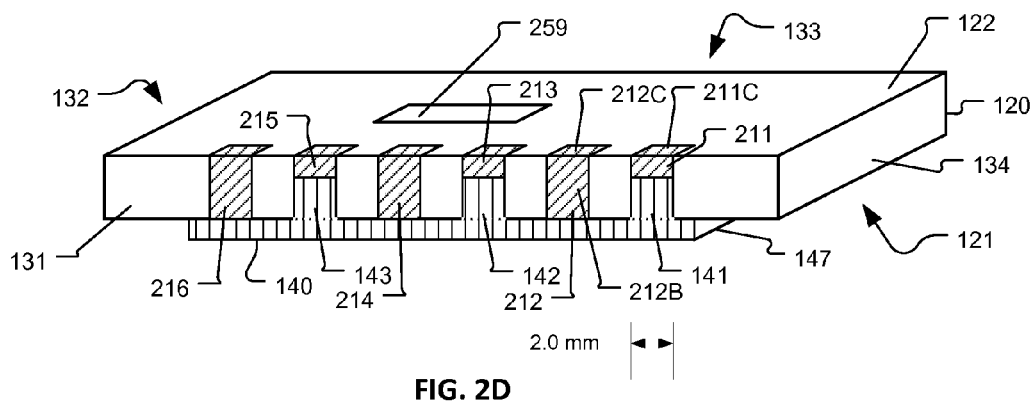

As illustrated in FIG. 2A and FIG. 2D, under some embodiments, tabs and grounding contacts may have certain dimensions, and it is to be understood that such dimensions are exemplary and not to be considered limiting. A tab may have a width of about 2 millimeters and a length that is about from 20% to 80% of the length of the first side surface 131. For example, if a length of a first side surface 131 is about 1 millimeter, then the length of a tab may be about from 0.2 millimeters to 0.8 millimeters. Such a tab may be coupled to a grounding contact that has a width slightly less than the tab, a width substantially the same as the tab, or a width slightly more than the tab. Under some embodiments, if a tab has a width of about 2 millimeters, then a width of a grounding contact may be about from 1.90 millimeters to 1.95 millimeters. In some embodiments, a grounding contact may have a length that is approximately equal to the length of the first side surface 131. Under some embodiments, such a grounding contact 211 may have a first portion 211A that extends onto the first major surface 121 of a circuit board 120, as illustrated in FIG. 2A. Additionally, under some embodiments, a grounding contact 211 may have a third portion 211C that extends onto the second major surface 122 of the circuit board 120, as illustrated in FIG. 2D. In other embodiments, a grounding contact may have a length that is less than the length of the first side surface 131. Under some embodiments, there may be a space between grounding contacts, for example such a space may be about from 1 millimeter to 5 millimeters or more. Under some embodiments, if a tab has a width of about 2 millimeters, and a grounding contact has a width of about 1.9 millimeters, then a space between grounding contacts may be 2.1 millimeters. It is to be understood that such dimensions are exemplary and not to be considered limiting, as the spacing distance between grounding contacts may be based on the dimensions of a grounding contact, properties of a coupling material, such as solder, or the dimensions of a circuit board 120.

Under some embodiments, tabs of a first shield 140 may be positioned in a row. The first and last tabs may be exterior tabs of the row, and the middle tabs may be interior tabs of the row. Under such an embodiment, the interior tabs of the first shield 140 may be positioned between respective tabs of a second shield 150. For example, as depicted in FIG. 1, the interior tabs 142, 143, 144 may be positioned interior to the exterior tabs 141, 145. Under such an embodiment, the second tab 142 may be positioned between a first tab 151 and a second tab 152, the third tab 143 may be positioned between a second tab 152 and a third tab 153, and the fourth tab 144 may be positioned between a third tab 153 and a fourth tab 154. Furthermore, the first tab 141 may be adjacent the tab 151, and the fifth tab 145 may be adjacent the tab 154. Under such an embodiment, there may be a respective space between the tabs 141-145 of the first shield 140 and the tabs 151-154 of the second shield 150.

Under some embodiments, the tabs of the first shield 140 may be generally interposed or staggered with the tabs of the second shield 150. Similarly, the tabs of the second shield 150 may be generally interposed or staggered with the tabs of the first shield 140. It is to be understood that the interposing or staggering of tabs of a first shield 140 and a second shield 150 may take any pattern. For example, every two interior tabs of a first shield 140 may be adjacent respective two tabs of a second shield 150. Alternatively, there may be an alternating pattern such as two interior tabs of a first shield 140 being adjacent a respective one tab of a second shield 150, followed by one interior tab of the first shield 140 being adjacent a respective two tabs of a second shield 150. The interposed or staggered patterns of the tabs of the first shield 140 and the tabs of the second shield 150 are not meant to be limiting. Furthermore, an interposed or staggered pattern may be irregular or erratic based, for example, on the shape of a particular side surface of circuit board 120.

FIGS. 2A-2F illustrate example perspective views of exemplary results of steps of a process for populating a circuit board 120, in accordance with various embodiments of the present invention. FIG. 2A illustrates a circuit board 120 with a first major surface 121, a second major surface 122, a first side surface 131, a second side surface 132, a third side surface 133, and a fourth side surface 134. As illustrated in FIG. 2A, a first major surface 121 may be oriented to face up or to be opposite a gravitational force. A first electronic component 249 may be coupled to the first major surface 121, as discussed above. Although not visible in the perspective view of FIG. 2A, a second electronic component 259 may be coupled to the second major surface 122. The first side surface 131 may include a first grounding contact 211, a second grounding contact 212, a third grounding contact 213, a fourth grounding contact 214, a fifth grounding contact 215, and a sixth grounding contact 216. Each grounding contact may be gold plated and may be electrically coupled to a grounding portion, a grounding trace, a grounding plane, or other grounding feature of the circuit board 120.

Under some embodiments as illustrated in FIG. 2A, a grounding contact 211 may have an optional first portion 211A that extends onto or is proximate to the first major surface 121 of a circuit board 120. A grounding contact 211 may have a second portion 211B that extends onto or is proximate the first side surface 131 of the circuit board 120. As shown in FIG. 2D, a grounding contact 211 may have an optional third portion 211C that extends onto or is proximate to the second major surface 122 of a circuit board 120 Under some embodiments, coupling material, such as solder paste, may be deposited on all or portions of a grounding contact. For example, coupling material may be deposited on the first portion 211A. For further example, coupling material may be deposited on the first portion 211A and the second portion 211B of the grounding contact 211. It is to be understood that a grounding contact may have one or more portions extending onto a major surface of circuit board 120, such as a grounding contact 212 having a first portion 212A proximate the first major surface 121, a second portion 212B proximate the first side surface 131, and as shown in FIG. 2D, a third portion 212C proximate the second major surface 122.

The grounding contacts of the first side surface 131 may be grouped into two sets of grounding contacts. For example, a first set of grounding contacts may comprise a first grounding contact 211, a third grounding contact 213, and a fifth grounding contact 215. Furthermore, a second set of grounding contacts may comprise a second grounding contact 212, and a fourth grounding contact 214. As illustrated in FIG. 2A, each grounding contact of such a second set of grounding contacts may be positioned between a respective two grounding contacts of a first set of grounding contacts or positioned between respective two adjacent grounding contacts of a first set of grounding contacts. It is to be understood that, if a grounding contact of a set of grounding contacts is on the exterior position of a set, such as a sixth grounding contact 216, it may not be positioned between two grounding contacts of another set of grounding contacts. It is to be further understood that the illustrated pattern of sets of grounding contacts is not meant to be limiting, and may have any generally interposed or staggered pattern.

It is to be understood that the number of grounding contacts on a side surface is not meant to be limiting. Furthermore, the illustration of grounding contacts on the first side surface 131 is for illustrative purposes and not meant to be limiting. For example, there may be grounding contacts associated with other side surfaces of a circuit board 120, such as a second side surface 132.

FIG. 2B illustrates the circuit board 120 of FIG. 2A. Under some embodiments, a preform, such as a coupling material preform or a solder preform, may be applied to a respective grounding contact of the first side surface 131. As illustrated in FIG. 2B, a first preform 241 may be applied to a first grounding contact 211, a second preform 242 may be applied to a third grounding contact 213, and a third preform 243 may be applied to a fifth grounding contact 215. A preform may be applied to a respective grounding contact with a pick-and-place device or system, and may be applied to a first portion of a grounding contact, such as applying the preform 241 to the first portion 211A of the grounding contact 211. It is to be understood that a preform may be applied to other portions of a grounding contact. Under some embodiments, a preform may be formed into a shape, such as a rectangular shape or a circular shape, and a preform may have a length of about 0.5 millimeters, a width of about 0.25 millimeters, and a height of about 0.25 millimeters.

It is to be understood that under some embodiments, the application of a preform to a grounding contact is optional. For example, under some embodiments, coupling material, such as solder paste, may be deposited on each grounding contact as described above for FIG. 2A or below for FIGS. 3A-3C.

FIG. 2C illustrates the circuit board 120 of FIG. 2B. As illustrated in FIG. 2C, a first shield 140 may be coupled to a circuit board 120. For example, a first shield 140 may be placed on a circuit board 120 with a pick-and-place device or system. Under some embodiments, a pick-and-place device or system may apply flux to a tab of a first shield 140, such as by dipping the tab into flux, in order to increase the coupling activity of the tab to a respective grounding contact.

Under some embodiments, the tabs of the first shield 140 may be respectively coupled to a first set of grounding contacts comprising a first grounding contact 211, a third grounding contact 213, and a fifth grounding contact 215. For further example, a first tab 141 may be coupled to a first grounding contact 211, a second tab 142 may be coupled to a third grounding contact 213, and a third tab 143 may be coupled to a fifth grounding contact 215. Under some embodiments, the coupling of a tab to a grounding contact may include heating the coupling material, such as the optionally applied preform or other deposited coupling material. It is to be appreciated that if a preform 241 is applied to a first portion 211A of a grounding contact 211, and the first major surface 121 of the circuit board 120 is facing up, when the first preform 241 is heated, gravity or surface tension may draw a volume of melted coupling material from the first portion 211A to the second portion 211B, such that the volume of melted coupling material may be located in between at least a portion of a tab 141 and at least a portion of a grounding contact 211. In some embodiments, the volume of melted coupling material may not flow all the way down a side surface, for example, the volume of melted coupling material may be greater at the portion of a grounding contact closer to the first major surface 121 and lesser at the portion of a grounding contact closer to the second major surface 122.

The first shield 140 may comprise a first planar portion 147 that may be positioned over all or a portion of a first major surface 121 and may be positioned over corresponding electronic components, such as an electronic component 249. Under some embodiments, the first shield 140 may be coupled to the first major surface 121 via one or more major surface tabs 149, such as end caps, pins, legs, fences, mounting points, and the like. In some embodiments, a major surface tab 149 may be coupled or mounted to a feature or structure of a first major surface 121, such as a pad, a land, a trace, a track, a via, and the like.

FIG. 2D illustrates the circuit board 120 of FIG. 2C, which is oriented so that the second major surface is facing up or is opposite a gravitational force. As illustrated in FIG. 2D, a second portion 212B of the grounding contact 212 may be aligned with or proximate to the first side surface 131 of the circuit board 120. A third portion 213C of the grounding contact 212 may be aligned with or proximate to the second major surface 122 of the circuit board 120. It is to be understood that a first portion 212A may not be visible in FIG. 2D because it may be covered by the first shield 140.

Figure 2E:
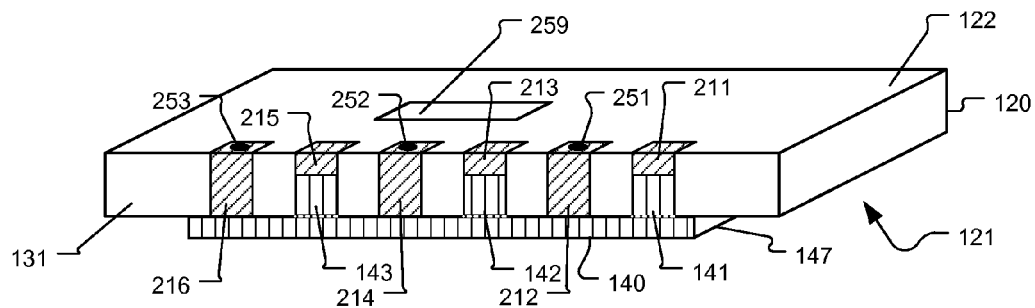

FIG. 2E illustrates the circuit board 120 of FIG. 2D. Similar to the embodiment described above in reference to FIG. 2B, a preform, such as a coupling material preform or a solder preform, may be applied to a respective grounding contact of the first side surface 131. As illustrated in FIG. 2E, a first preform 251 may be applied to a second grounding contact 212, a second preform 252 may be applied to a fourth grounding contact 214, and a third preform 253 may be applied to a sixth grounding contact 216. A preform may be applied to a respective grounding contact with a pick-and-place device or system, and may be applied to a third portion of a grounding contact, such as applying the preform 251 to the third portion 212C of the grounding contact 212. It is to be understood that a preform may be applied to other portions of a grounding contact, such as the second portion 212B.

Figure 2F:
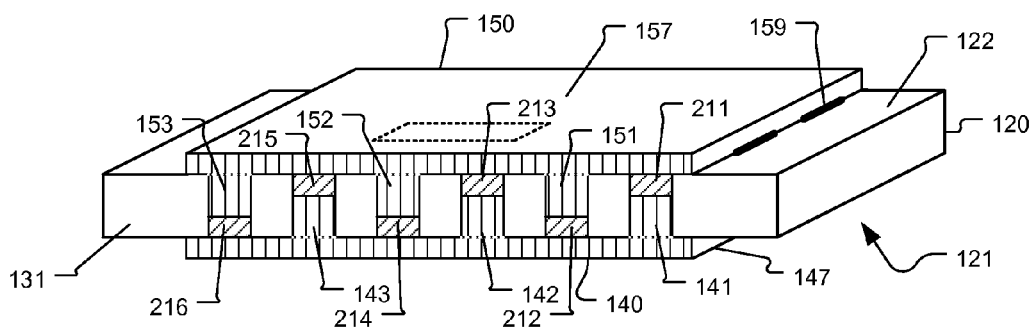

FIG. 2F illustrates the circuit board 120 of FIG. 2E. As illustrated in FIG. 2F, a second shield 150 may be coupled to a circuit board 120. For example, a second shield 150 may be placed on a circuit board 120 with a pick-and-place device or system. Under some embodiments, the tabs of the second shield 150 may be respectively coupled to a second set of grounding contacts comprising a second grounding contact 212 and fourth grounding contact 214. For further example, a first tab 151 may be coupled to a second grounding contact 212 and a second tab 152 may be coupled to a fourth grounding contact 214. Additionally, a third tab 153 may be coupled to a sixth grounding contact 216.

Similar to the embodiment described above in reference to FIG. 2C, the coupling of a tab to a grounding contact may include heating the coupling material, such as the optionally applied preform or other deposited coupling material. It is to be appreciated that if a first preform 251 is applied to a third portion 212C of a grounding contact 212, and the second major surface 122 of the circuit board 120 is facing up, when the first preform 251 is heated, gravity or surface tension may draw a volume of melted coupling material from the third portion 212C to the second portion 212B, such that the volume of melted coupling material may be located in between at least a portion of a tab 151 and at least a portion of a grounding contact 212.

The second shield 150 may comprise a second planar portion 157 that may be positioned over all or a portion of a second major surface 122 and may be positioned over corresponding electronic components, such as an electronic component 259. Under some embodiments, the second shield 150 may be coupled to the second major surface 122 via one or more major surface tabs 159.

Under some embodiments, the location of the tabs of the first shield 140 in relation to the tabs of the second shield 150 may be advantageous when melting coupling material associated with the first shield 140. For example, if the second major surface 122 of the circuit board 120 is facing down, then gravity or surface tension may cause excess melted solder to flow towards the second major surface 122 when coupling the first shield 140 to the circuit board 120. Under an embodiment, if the excess melted solder comes in contact with the second shield 140 or other conductive component on the second major surface 122, an undesirable short circuit may result. In another embodiment, because the respective tabs of the second shield 150 would not be directly beneath a tab of the first shield 140, melted solder from a preform associated with a tab of the first shield 140, such as the first preform 241, would not flow onto a grounding contact associated with tabs of a second shield 150. Specifically, as illustrated in FIG. 1, the tabs of the second shield 150 would not be beneath the respective tabs of the first shield 140, and the coupling material associated with the tabs of the first shield 140 would not contact, intrude or add additional volume to the coupling material associated with the tabs of the second shield 150. Accordingly, the volume of the coupling material associated with any one tab of the second shield 150 may not be increased due to intrusion of the coupling material associated with any one tab of the first shield 140.

Figure 3A:
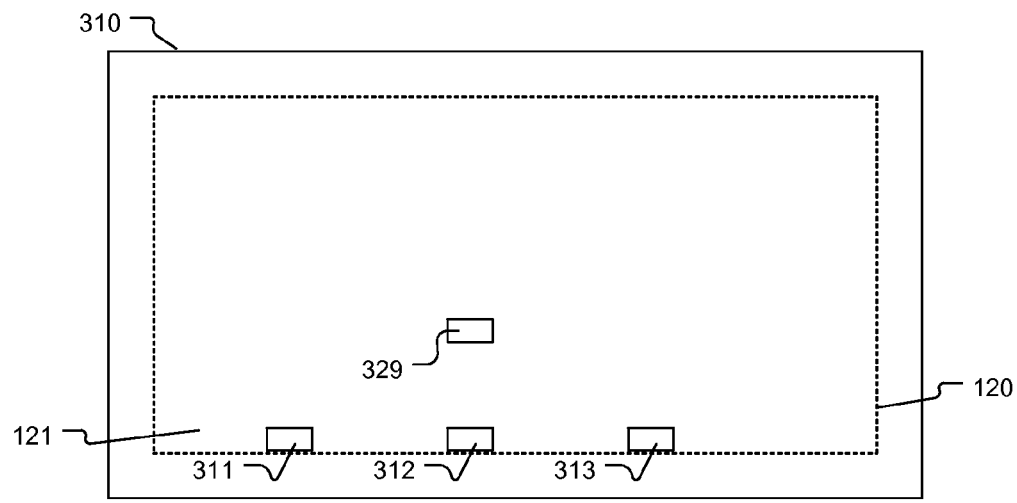
FIGS. 3A-3C illustrate an example top view of a stencil and example portions of schematic cross-sectional views of a stencil, in accordance with various embodiments of the present invention.
Figure 3B:
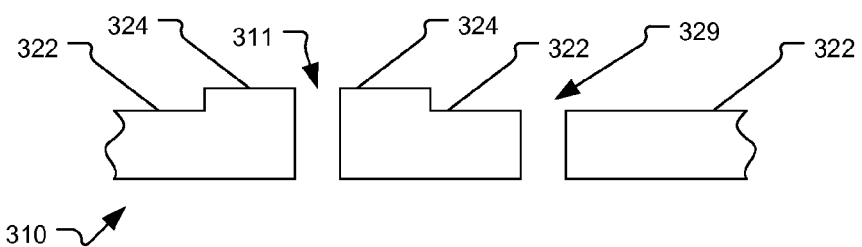
Figure 3C:
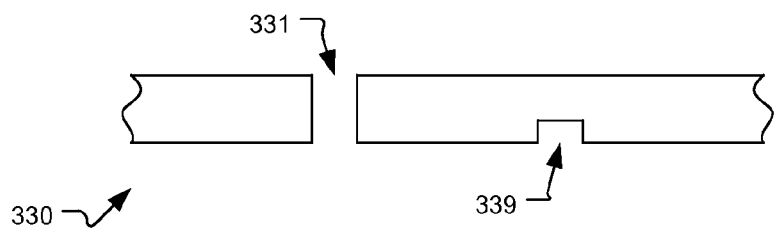

FIGS. 3A-3C illustrate an example top view of a stencil 310 and example portions of schematic cross-sectional views of a stencil 310 and a second stencil 330, in accordance with various embodiments of the present invention. FIG. 3A illustrates an example top view of a stencil 310. A stencil 310 may be utilized to deposit or print a coupling material, such as solder paste, on a grounding contact of a circuit board 120. As illustrated in FIG. 3A, a stencil 310 may be placed over a first major surface 121 of a circuit board 120. The stencil 310 may have apertures that correspond to the layout of the grounding contacts. For example, the stencil 310 may include a first aperture 311, a second aperture 312, and a third aperture 313. Each of these apertures 311-313 may correspond respectively to a first portion of the first grounding contact 211, a first portion of the third grounding contact 213, and a first portion of the fifth grounding contact 215, as illustrated in FIG. 2A. Additionally, a stencil 310 may have one or more apertures 329 for depositing a coupling material on pads of the first major surface 121 in relation to one or more electronic components, such as the electronic component 249 shown in FIG. 2A.

Under some embodiments, the stencil 310 may be placed over or aligned with the first major surface 121 of the circuit board 120. For example, a stencil 310 may be positioned proximate and parallel to the first major surface 121. A coupling material, such as solder paste, may be forced through each aperture and deposited or transferred onto a corresponding grounding contact, such as a grounding contact's first portion located on a first major surface 121 of a circuit board 120. The volume of coupling material that may pass through an aperture may be influenced by an aperture size and a thickness of the stencil 310. Under an embodiment, the stencil 310 may have a uniform thickness, such as a non-step stencil.

It is to be understood that although FIG. 3A illustrates a stencil 310 placed over a first major surface 121 of a circuit board 120, it is to be understood that a stencil 310 may be placed over a second major surface 122 of a circuit board 120, and coupling material may be deposited on a grounding contact's third portion located on the second major surface 122. Additionally, a stencil 310 may be placed over a first side surface 131 of a circuit board 120, and coupling material may be deposited on a grounding contact's second portion located on the first side surface 131.

FIG. 3B illustrates an example portion of a schematic cross-sectional view of a stencil 310 that has a variable thickness, such as a step stencil. Under some embodiments, a thicker thickness around an aperture may provide increased volume of coupling material through the aperture. As illustrated in FIG. 3B, a stencil 310 may have a thickness, such as the thickness of the non-stepped region 322. The stencil 310 may have a stepped region 324 surrounding an aperture 311 that corresponds to a grounding contact of the circuit board 120. The additional thickness or step up of the stepped region 324 may allow additional coupling material to be forced through the aperture 311, in comparison to coupling material forced through an aperture 329 located in the non-stepped region 322, in which the aperture 329 does not require additional volume of coupling material. It is to be understood that under some embodiments, rather than stepping up a thickness in the stepped region 324, a region around an aperture 329 may be stepped down in thickness.

FIG. 3C illustrates an example portion of a schematic cross-sectional view of a stencil 330 that is similar to the stencil 310 and that has a relief pocket 339, such as a two-print stencil with one or more relief pockets. As illustrated in FIG. 3C, the stencil 330 may be utilized as a second stencil after a first stencil deposited an initial volume of coupling material to a grounding contact of a circuit board 120. For example, if a first volume of coupling material were deposited to a grounding contact 211 of FIG. 2A via the aperture 311 of a first stencil 310 of FIG. 3B, then a second volume of coupling material could be deposited to the grounding contact 211 via the aperture 331 of the second stencil 330, such as depositing a second volume of coupling material over a first volume of coupling material. Additionally, if coupling material were deposited via the aperture 329 of the first stencil 310 of FIG. 3B, and no additional coupling material were desired to be deposited, then the relief pocket 339 may provide space for that initially deposited coupling material to reside when the second stencil 330 is placed over the first major surface 121 of the circuit board 120. In some embodiments, the relief pocket 339 of the second stencil 330 may correspond to an aperture 329 of the first stencil 310, in which no additional deposit of coupling material is desired at the location of the relief pocket 339.

It is to be understood that the heating of coupling material deposited onto a first portion of a grounding contact with one or more stencils is similar to the heating of a preform applied to a first portion of a grounding contact described above. It is to be further understood that an embodiment may include a combination of depositing coupling material to a grounding contact with one or more stencils, as illustrated in FIGS. 3A-3C, and applying a preform to the deposited coupling material with a pick and place system, as illustrated in FIGS. 2A-2F.

Figure 4:
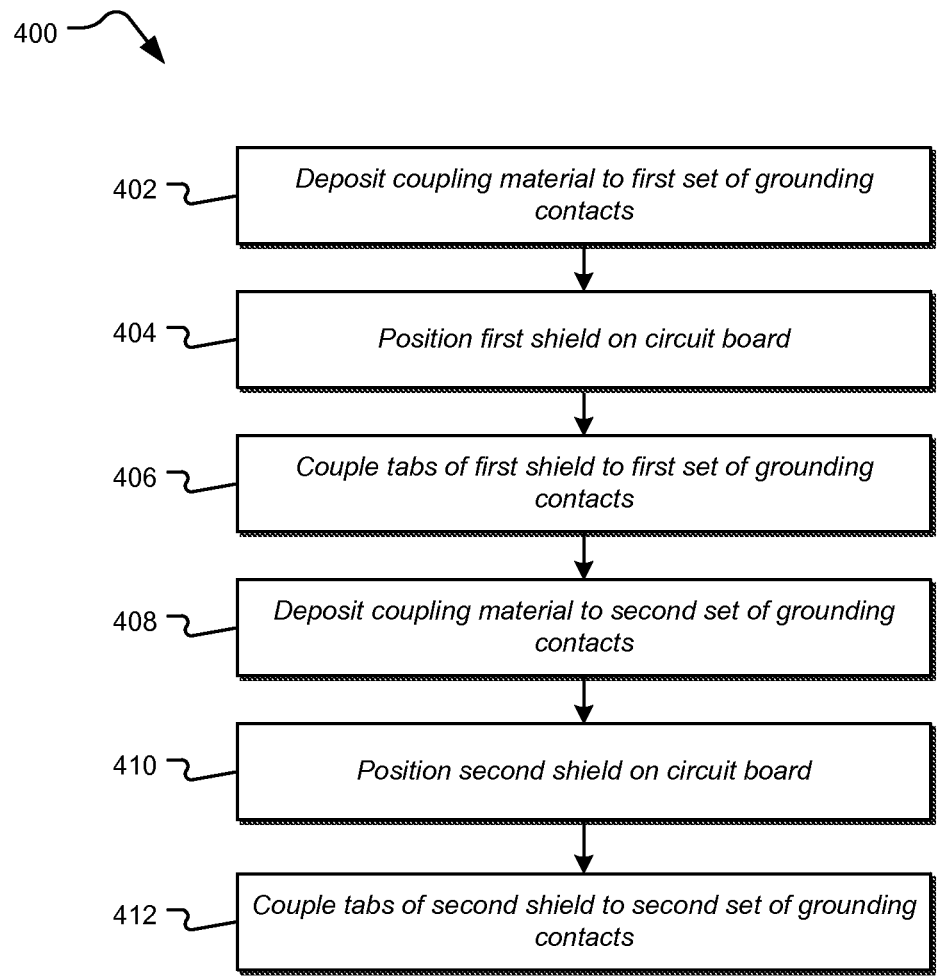
FIG. 4 illustrates an example flow diagram of a process of populating a circuit board, in accordance with various embodiments of the present invention.

FIG. 4 illustrates an example flow diagram of a process 400 of populating a circuit board 120, in accordance with various embodiments of the present invention. At step 402, coupling material is deposited on a first set of grounding contacts 211, 213, 215 of a first side surface 131 of the circuit board 120. At step 404, a first shield 140 is positioned and placed on the circuit board 120. At step 406, the tabs 141, 142, 143 of the first shield 140 are coupled to the first set of grounding contacts 211, 213, 215. At step 408, coupling material is deposited on a second set of grounding contacts 212, 214 of the first side surface 131 of the circuit board 120, wherein at least one grounding contact of the first set of grounding contacts is positioned between a respective two grounding contacts of the second set of grounding contacts or positioned between respective two adjacent grounding contacts of the second set of grounding contacts. At step 410, a second shield 150 is positioned and placed on the circuit board 120. At step 412, the tabs 151, 152 of the second shield 150 are coupled to the second set of grounding contacts 212, 214.

Figure 5:
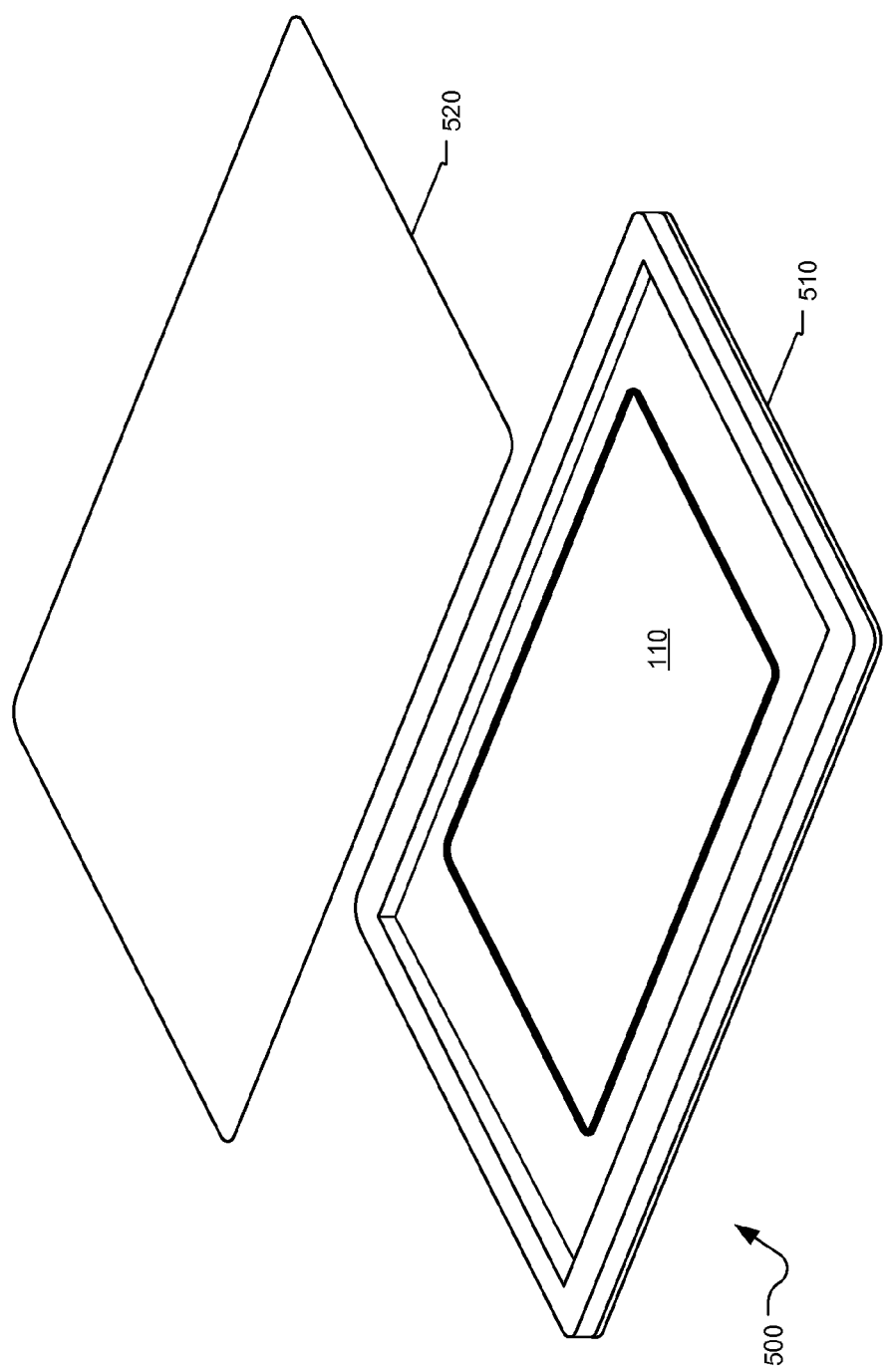
FIG. 5 illustrates an exploded perspective view of an example electronic device, in accordance with various embodiments of the present invention.

FIG. 5 illustrates a simplified exploded perspective view of an example electronic device 500, in accordance with various embodiments of the present invention. In the illustrated embodiment, a circuit board assembly 110 may be coupled to a housing 510, and a display component 520 may be coupled to the housing 510.

Figure 6:
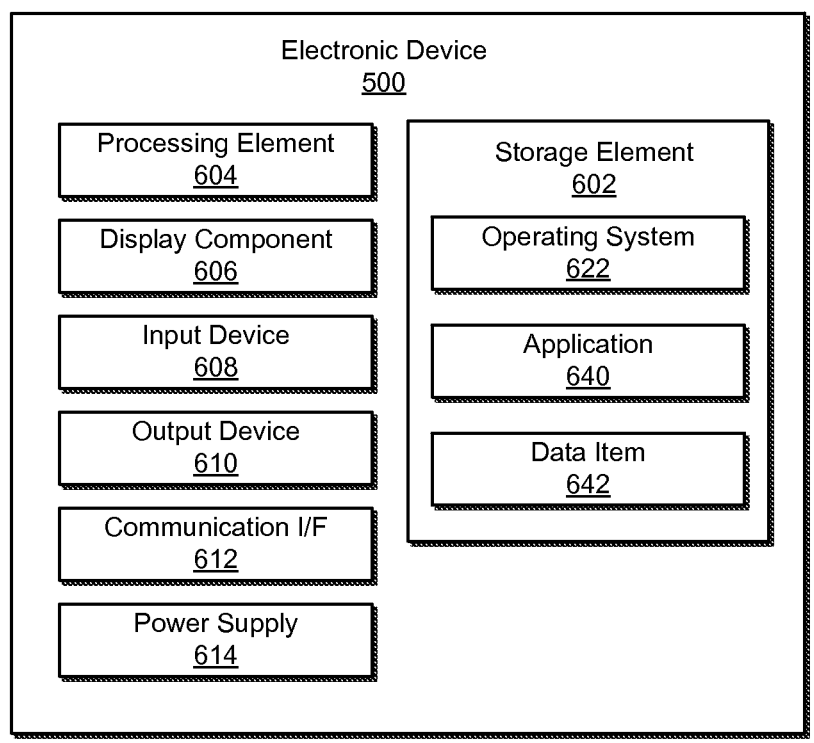
FIG. 6 illustrates an example block diagram of an electronic device, in accordance with embodiments of the present invention.

FIG. 6 illustrates an example block diagram of an electronic device 500, in accordance with embodiments of the present invention. The electronic device 500 may be implemented as any of a number of electronic devices, such as an e-book reader, a tablet computing device, a smartphone, a media player, a portable gaming device, a portable digital assistant, a laptop computer, a desktop computer, and other devices providing media presentation functionality. It should be understood that various types of computing devices including a processing element, a memory, and a user interface for receiving user input can be used in accordance with various embodiments discussed herein.

The electronic device 500 may include a display component 606. The display component 606 may comprise, for example, one or more devices such as cathode ray tubes (CRTs), liquid crystal display (LCD) screens, gas plasma-based flat panel displays, LCD projectors, or other types of display devices, etc. The electronic device 500 may include one or more input devices 608 operable to receive inputs from a user. The input devices 608 can include, for example, a push button, touch pad, touch screen, wheel, joystick, keyboard, mouse, trackball, keypad, accelerometer, light gun, game controller, or any other such device or element whereby a user can provide inputs to the electronic device 500. These input devices 608 may be incorporated into the electronic device 500 or operably coupled to the electronic device 500 via wired or wireless interface. For computing devices with touch sensitive displays, the input devices 608 can include a touch sensor that operates in conjunction with the display component 606 to permit users to interact with the image displayed by the display component 606 using touch inputs (e.g., with a finger or stylus).

The electronic device 500 may also include at least one communication interface 612, comprising one or more wireless components operable to communicate with one or more separate devices within a communication range of the particular wireless protocol. The wireless protocol can be any appropriate protocol used to enable devices to communicate wirelessly, such as Bluetooth, cellular, IEEE 802.11, or infrared communications protocols, such as an IrDA-compliant protocol. It should be understood that the electronic device 500 may also include one or more wired communications interfaces for coupling and communicating with other devices. The electronic device 500 may also include a power supply 614, such as, for example, a rechargeable battery operable to be recharged through conventional plug-in approaches, or through other approaches such as capacitive charging.

The electronic device 500 may also include a processing element 604 for executing instructions and retrieving data stored in a storage element 602. As would be apparent to one of ordinary skill in the art, the storage element 602 can include one or more different types of memory, data storage or computer-readable storage media, such as, for example, a first data storage for program instructions for execution by the processing element 604, and a second data storage for images or data and/or a removable storage for transferring data to other devices. The storage element 602 may store software for execution by the processing element 604, such as, for example, operating system software 622 and applications 640. The storage element 602 may also store a data item 642, such as, for example, data files corresponding to one or more applications 640.

Embodiments of the present invention may provide various advantages not provided by prior art systems. An exemplary advantage of some disclosed embodiments may be increased component density through utilization of space on a major surface of a circuit board that otherwise would have been consumed by the coupling of a shield to the major surface of the circuit board assembly. Furthermore, the circuit board assembly according to some disclosed embodiments may utilize space on a side surface of the circuit board that otherwise may have not been utilized, and thus wasted. Another exemplary advantage of some disclosed embodiments is that the utilization of the space on a side surface of a circuit board may involve an assembly process that does not require relatively expensive solder paste dispensing equipment to couple tabs of a first shield and tabs of a second shield to a side surface of a circuit board assembly. For example, when the tabs of the first shield are staggered with the tabs of the second shield, there is a gap provided between the respective tabs that may accommodate overflow of coupling material, such as solder. Accordingly, a relatively imprecise volume of solder may be delivered to grounding contacts by relatively lower cost equipment, which may result in reduced manufacturing costs and increased production rates. For further example, when the tabs from the first shield do not abut with the tabs from the second shield, there is less risk of melted solder from the prior coupling of a tab of a first shield flowing onto a grounding contact where a tab of a second shield might be coupled. Accordingly, there is less risk of excess volume of solder flowing to a neighboring grounding contact, and thus less risk of increased height or excess volume of solder underneath a neighboring tab.

While the invention has been described in terms of particular embodiments and illustrative figures, those of ordinary skill in the art will recognize that the invention is not limited to the embodiments or figures described. Many of the embodiments described above in relation to circuit boards, printed circuit boards, printed circuit board assemblies, and the like may be applied to other embodiments of substrates that mechanically couple components and that electrically couple electronic components via conductive traces, tracks, pads, lands, vias, planes, structures, and the like. For example, many of the embodiments described above may be applied to flexible circuit structures or flexible electronics in which electronic components are mounted to a flexible substrate that may conform to a desired shape or be flexible during use.

Although various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and, consequently, are not described in detail herein. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the processes, flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer-readable medium for use by or in connection with an instruction execution system such as a processing component in a computer system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. An electronic device, comprising:
a circuit board comprising:
a first major surface;
a second major surface opposed to the first major surface; and
a first side surface extending between the first major surface and the second major surface, the first side surface having a first set of grounding contacts and a second set of grounding contacts, wherein at least one grounding contact of the second set of grounding contacts is positioned between two adjacent grounding contacts of the first set of grounding contacts;

a first electronic component electrically coupled to the first major surface of the circuit board;
a second electronic component electrically coupled to the second major surface of the circuit board;
a first shield comprising a first planar portion and a first plurality of tabs extending from the first planar portion, wherein the first planar portion is positioned over the first electronic component and is substantially parallel to the first major surface, and wherein each of the first plurality of tabs is coupled to the first side surface and electrically coupled to a respective grounding contact of the first set of grounding contacts; and
a second shield comprising a second planar portion and a second plurality of tabs extending from the second planar portion, wherein the second planar portion is positioned over the second electronic component and is substantially parallel to the second major surface, and wherein each of the second plurality of tabs is coupled to the first side surface and electrically coupled to a respective grounding contact of the second set of grounding contacts.

2. The electronic device of claim 1, wherein the circuit board further comprises:
a second side surface extending between the first major surface and the second major surface, the second side surface having a third set of grounding contacts and a fourth set of grounding contacts, wherein at least one grounding contact of the fourth set of grounding contacts is positioned between two adjacent grounding contacts of the third set of grounding contacts,
wherein the first shield further comprises a third plurality of tabs extending from the first planar portion, wherein each of the third plurality of tabs is coupled to the second side surface and electrically coupled to a respective grounding contact of the third set of grounding contacts,
wherein the second shield further comprises a fourth plurality of tabs extending from the second planar portion, wherein each of the fourth plurality of tabs is coupled to the second side surface and electrically coupled to a respective grounding contact of the fourth set of grounding contacts.

3. The electronic device of claim 1, wherein:
each of the first plurality of tabs comprises a base layer of a copper material, a first plating layer of a silver material, and a second plating layer of a nickel material.

4. An electronic device, comprising:
a circuit board comprising:
a first major surface;
a second major surface opposed to the first major surface; and
a first side surface extending between the first major surface and the second major surface, the first side surface having a first set of grounding contacts and a second set of grounding contacts, wherein at least one grounding contact of the first set of grounding contacts is positioned between two adjacent grounding contacts of the second set of grounding contacts;
a first shield comprising a first planar portion and a first plurality of tabs extending from the first planar portion, wherein each of the first plurality of tabs is electrically coupled to a respective grounding contact of the first set of grounding contacts; and
a second shield comprising a second planar portion and a second plurality of tabs extending from the second planar portion, wherein each of the second plurality of tabs is electrically coupled to a respective grounding contact of the second set of grounding contacts.

5. The electronic device of claim 4, wherein:
a first grounding contact of the first set of grounding contacts comprises a first portion extending over a portion of the first major surface of the circuit board and a second portion extending over a portion of the first side surface of the circuit board, wherein a first tab of the first plurality of tabs is coupled to the second portion of the first grounding contact.

6. The electronic device of claim 5, wherein:
a second grounding contact of the second set of grounding contacts comprises a third portion extending over a portion of the second major surface of the circuit board and a fourth portion extending over a portion of the first side surface of the circuit board, wherein a second tab of the second plurality of tabs is coupled to the fourth portion of the second grounding contact.

7. The electronic device of claim 4, wherein:
the first shield and the second shield comprise a conductive metal.

8. The electronic device of claim 4, wherein:
each tab in the first plurality of tabs is coupled to its respective grounding contact via solder.

9. The electronic device of claim 4, further comprising:
a first electronic component electrically coupled to the first major surface of the circuit board, wherein the first planar portion is positioned substantially parallel to the first major surface and over the first electronic component; and
a second electronic component electrically coupled to the second major surface of the circuit board, wherein the second planar portion is positioned substantially parallel to the second major surface and over the second electronic component.

10. The electronic device of claim 9, wherein:
the first planar portion comprises a conductive material, the first planar portion enveloping the first electronic component; and
the second planar portion comprises the conductive material, the second planar portion enveloping the second electronic component.

11. The electronic device of claim 4, wherein the circuit board further comprises:
a second side surface extending between the first major surface and the second major surface, wherein the first shield comprises a third plurality of tabs coupled to the second side surface and the second shield comprises a fourth plurality of tabs coupled to the second side surface;
a third side surface extending between the first major surface and the second major surface, wherein the first shield comprises a fifth plurality of tabs coupled to the third side surface and the second shield comprises a sixth plurality of tabs coupled to the third side surface; and
a fourth side surface extending between the first major surface and the second major surface, wherein the first shield comprises a seventh plurality of tabs coupled to the fourth side surface and the second shield comprises an eighth plurality of tabs coupled to the fourth side surface.

12. The electronic device of claim 4, further comprising:
a first electronic component electrically coupled to a first area of the first major surface of the circuit board;
a second electronic component electrically coupled to a second area of the first major surface of the circuit board,
wherein the first planar portion is positioned over the first area, and wherein the first area is different from the second area.

13. The electronic device of claim 12, wherein the first shield further comprises:
a major surface tab electrically coupled to a grounding contact of the first major surface of the circuit board.

14. The electronic device of claim 4, wherein:
at least one grounding contact of the first set of grounding contacts is positioned between two adjacent grounding contacts of the second set of grounding contacts such that a first gap is disposed between the grounding contact and a first one of the two adjacent grounding contacts and a second gap is disposed between the grounding contact and a second one of the two adjacent grounding contacts.

15. The electronic device of claim 4, further comprising:
a first preform disposed between a first tab of the first plurality of tabs and a first grounding contact of the first set of grounding contacts, the first preform electrically coupling the first tab to the first grounding contact.

16. The electronic device of claim 15, further comprising:
a second preform disposed between a second tab of the second plurality of tabs and a second grounding contact of the second set of grounding contacts, the second preform electrically coupling the second tab to the second grounding contact.

17. An electronic device, comprising:
a circuit board comprising:
a first major surface;
a second major surface opposed to the first major surface; and
a first side surface extending between the first major surface and the second major surface, the first side surface having a first set of grounding contacts and a second set of grounding contacts, wherein at least one grounding contact of the first set of grounding contacts is positioned between two adjacent grounding contacts of the second set of grounding contacts;
a first shield comprising an electrically conductive material, wherein the first shield further comprises a first portion and a first plurality of tabs extending from the first portion, wherein each of the first plurality of tabs is electrically coupled to a respective grounding contact of the first set of grounding contacts; and
a second shield comprising an electrically conductive material, wherein the second shield further comprises a second portion and a second plurality of tabs extending from the second portion, wherein each of the second plurality of tabs is electrically coupled to a respective grounding contact of the second set of grounding contacts.

18. The electronic device of claim 17, wherein the first portion of the first shield includes corrugation, ridges, valleys, ribs, or dents.

19. The electronic device of claim 17, wherein the first shield comprises a nonconductive material plated with a conductive material.

20. The electronic device of claim 17, wherein the first plurality of tabs have a first length of between 20% and 80% of a second length of the first side surface.

* * * * *